(12) United States Patent
Furukawa et al.

(10) Patent No.: US 7,517,716 B2
(45) Date of Patent: Apr. 14, 2009

(54) METHOD OF FORMING OPTICAL SENSOR THAT INCLUDES THREE PAIRS OF ELECTRODES FORMED AT DIFFERENT DEPTHS IN A SEMICONDUCTOR SUBSTRATE

(75) Inventors: Toshiharu Furukawa, Essex Junction, VT (US); Steven J. Holmes, Guilderland, NY (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/042,375

(22) Filed: Mar. 5, 2008

(65) Prior Publication Data
US 2008/0153195 A1    Jun. 26, 2008

Related U.S. Application Data

(62) Division of application No. 11/164,217, filed on Nov. 15, 2005, now Pat. No. 7,378,717.

(51) Int. Cl.
*H01L 31/18* (2006.01)
(52) U.S. Cl. ............... 438/74; 438/98; 257/E31.124
(58) Field of Classification Search .......... 438/74, 438/90; 257/E31.124
See application file for complete search history.

(56) References Cited

U.S. PATENT DOCUMENTS

| | | | |
|---|---|---|---|
| 5,559,336 A | 9/1996 | Kosai et al. | |
| 6,034,407 A | 3/2000 | Tennant et al. | |
| 6,204,087 B1 | 3/2001 | Parker et al. | |
| 6,720,595 B2 | 4/2004 | Clevenger et al. | |
| 7,339,216 B1* | 3/2008 | Lyon et al. | 257/291 |
| 2004/0135065 A1 | 7/2004 | Jang | |
| 2004/0232314 A1 | 11/2004 | Hong | |

* cited by examiner

*Primary Examiner*—Stephen W Smoot
(74) *Attorney, Agent, or Firm*—Schmeiser, Olsen & Watts; Anthony J. Canale

(57) ABSTRACT

A method for forming an optical sensor. First, a structure which comprises a semiconductor substrate is provided. Then, a first electrode and a fourth electrode are formed at a first depth in the semiconductor substrate. Then, a second electrode and a fifth electrode are formed at a second depth in the semiconductor substrate. Then, a third electrode and a sixth electrode are formed at a third depth in the semiconductor substrate. The first depth is greater than the second depth which is greater than the third depth. First, second, and third semiconducting regions of the semiconductor substrate are disposed between and in direct physical contact with the first and fourth electrodes, the second and fifth electrodes, and the third and sixth electrodes, respectively. The first, second, and third semi-conducting regions are in direct physical contact with one another.

5 Claims, 16 Drawing Sheets

METHOD OF FORMING OPTICAL SENSOR THAT INCLUDES THREE PAIRS OF ELECTRODES FORMED AT DIFFERENT DEPTHS IN A SEMICONDUCTOR SUBSTRATE

This application is a divisional of application claiming priority to Ser. No. 11/164,217, filed Nov. 15, 2005 now U.S. Pat. No. 7,378,717.

BACKGROUND OF THE INVENTION

1. Technical Field

The present invention relates to semiconductor structures, and more particularly, to semiconductor optical sensor structures having capability of collecting photons at different depths.

2. Related Art

Photons of different wave lengths after entering a semiconductor substrate will go down to different depths in the semiconductor substrate. Therefore, there is a need for a semiconductor optical sensor structure (and a method for forming the same) that can collect photons at different depths in the semiconductor substrate.

SUMMARY OF THE INVENTION

The present invention provides a semiconductor structure, comprising (a) a semiconductor substrate; (b) at least first and second electrode blocks in the semiconductor substrate, wherein the first electrode block comprises first, second, and third electrodes, wherein the second electrode block comprises fourth, fifth, and sixth electrodes, wherein the first and fourth electrodes are in direct physical contact with the semiconductor substrate at a first depth in the semiconductor substrate, wherein the second and fifth electrodes are in direct physical contact with the semiconductor substrate at a second depth in the semiconductor substrate, wherein the third and sixth electrodes are in direct physical contact with the semiconductor substrate at a third depth in the semiconductor substrate, and wherein the first depth is greater than the second depth, and the second depth is greater than the third depth; and (c) a semiconducting block in the semiconductor substrate, wherein the semiconducting block is disposed between the first and second electrode blocks, wherein the semiconducting block comprises first, second, and third semiconducting regions, wherein the first semiconducting region is disposed between and in direct physical contact with the first and fourth electrodes, wherein the second semiconducting region is disposed between and in direct physical contact with the second and fifth electrodes, wherein the third semiconducting region is disposed between and in direct physical contact with the third and sixth electrodes, wherein the first, second, and third semiconducting regions are in direct physical contact with each other, wherein there is no portion of the first, second, third, fourth, fifth and sixth electrodes disposed between the first and second semiconducting regions, and wherein there is no portion of the first, second, third, fourth, fifth and sixth electrodes disposed between the second and third semiconducting regions.

The present invention also provides a semiconductor structure, comprising (a) a semiconductor substrate; (b) at least first and second electrode blocks in the semiconductor substrate, wherein the first electrode block comprises first, second, and third electrodes, and first and second dielectric regions, wherein the second electrode block comprises fourth, fifth, and sixth electrodes, and third and fourth dielectric regions, wherein each of the first, second, fourth, and fifth electrodes has an L-shape, wherein vertical members of the L-shapes of the first, second, fourth, and fifth electrodes lead to a top surface of the semiconductor substrate, wherein the first and fourth electrodes are in direct physical contact with the semiconductor substrate at a first depth in the semiconductor substrate, wherein the second and fifth electrodes are in direct physical contact with the semiconductor substrate at a second depth in the semiconductor substrate, wherein the third and sixth electrodes are in direct physical contact with the semiconductor substrate at a third depth in the semiconductor substrate, wherein the first depth is greater than the second depth and the second depth is greater than the third depth, wherein the first dielectric region is sandwiched between the first and second electrodes, wherein the second dielectric region is sandwiched between the second and third electrodes, wherein the third dielectric region is sandwiched between the fourth and fifth electrodes, and wherein the fourth dielectric region is sandwiched between the fifth and sixth electrodes; and (c) a semiconducting block in the semiconductor substrate, wherein the semiconducting block is disposed between the first and second electrode blocks, wherein the semiconducting block comprises first, second, and third semiconducting regions, wherein the first semiconducting region is disposed between and in direct physical contact with the first and fourth electrodes, wherein the second semiconducting region is disposed between and in direct physical contact with the second and fifth electrodes, wherein the third semiconducting region is disposed between and in direct physical contact with the third and sixth electrodes, and wherein the first, second, and third semiconducting regions are in direct physical contact with each other.

The present invention also provides a semiconductor fabrication method, comprising providing a structure which comprises a semiconductor substrate; forming a first electrode and a fourth electrode at a first depth in the semiconductor substrate; after said forming the first and fourth electrodes is performed, forming a second electrode and a fifth electrode at a second depth in the semiconductor substrate; and after said forming the second and fifth electrodes is performed, forming a third electrode and a sixth electrode at a third depth in the semiconductor substrate, wherein the first depth is greater than the second depth, wherein the second depth is greater than the third depth, wherein a first semiconducting region of the semiconductor substrate is disposed between and in direct physical contact with the first and fourth electrodes, wherein a second semiconducting region of the semiconductor substrate is disposed between and in direct physical contact with the second and fifth electrodes, wherein the third semiconducting region of the semiconductor substrate is disposed between and in direct physical contact with the third and sixth electrodes, and wherein the first, second, and third semi-conducting regions are in direct physical contact with each other.

The present invention provides a semiconductor optical sensor structure (and a method for forming the same) that can collect photons at different depths in the semiconductor substrate.

DETAILED DESCRIPTION OF THE INVENTION

FIGS. 1-13D show a first fabrication process for forming a semiconductor optical sensor 100, in accordance with embodiments of the present invention, wherein FIGS. 1-12B show perspective views, and FIGS. 12C-13D show cross-section views.

Figure 1:
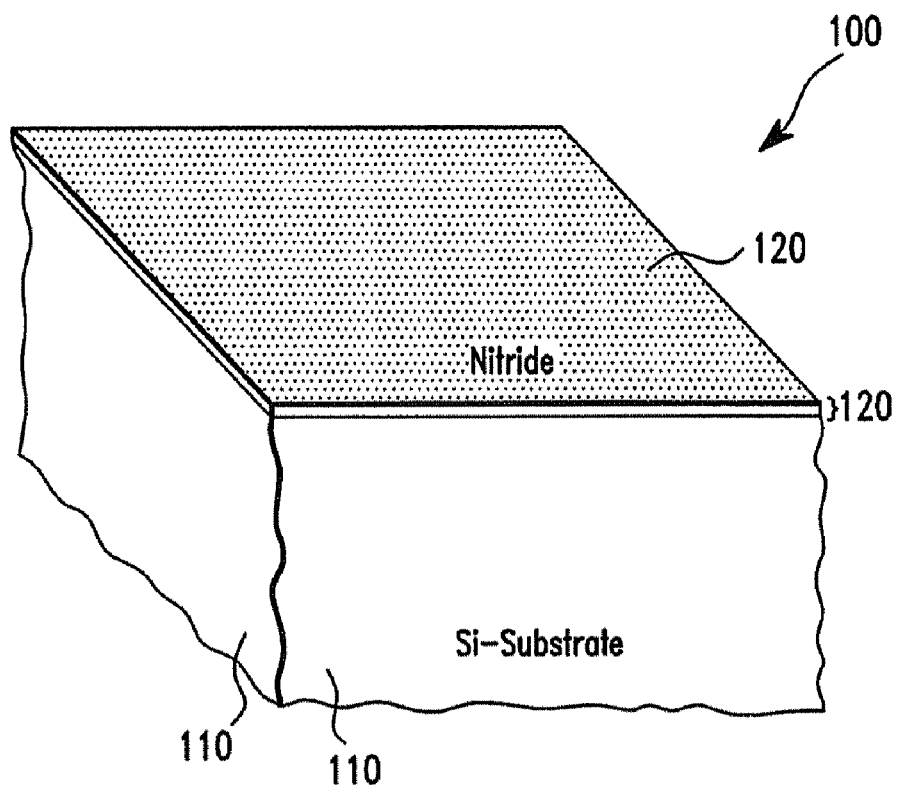
FIGS. 1-13D show the fabrication process and operation of a semiconductor optical sensor, in accordance with embodiments of the present invention.

More specifically with reference to FIG. 1, in one embodiment, the first fabrication process starts out with a p-type silicon substrate 110. Next, in one embodiment, a nitride polish stop layer 120 is formed on top of the p-type silicon substrate 110. Illustratively, the nitride polish stop layer 120 is formed by CVD (Chemical Vapor Deposition).

Figure 2:
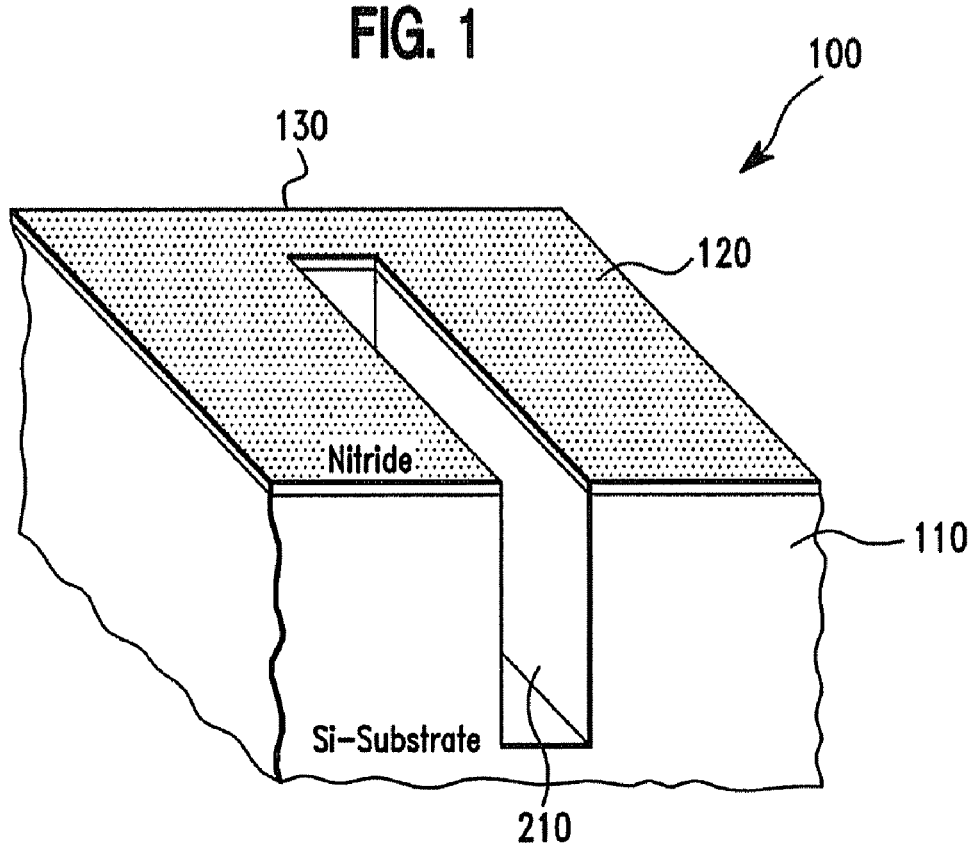

Next, with reference to FIG. 2, in one embodiment, a trench 210 is formed in the nitride polish stop layer 120 and the p-type silicon substrate 110. Illustratively, the trench 210 is formed by a conventional lithographic process followed by an etching step.

Figure 3:
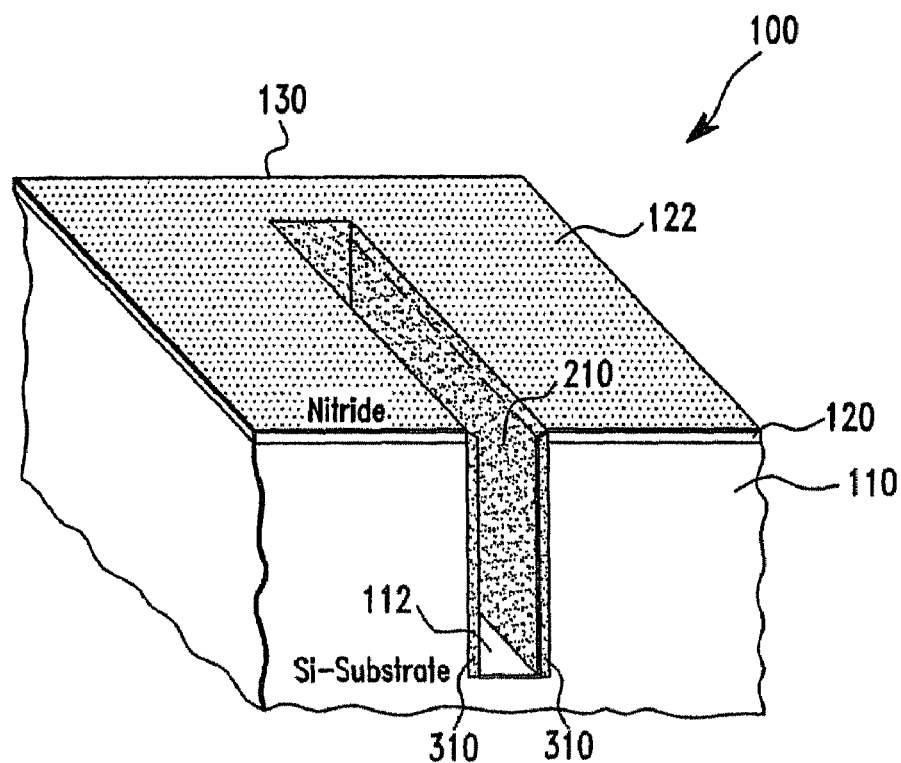

Next, with reference to FIG. 3, in one embodiment, a dielectric side wall region 310 is formed on side walls of the trench 210. In one embodiment, the dielectric side wall region 310 comprises silicon dioxide. Illustratively, the silicon dioxide side wall region 310 is formed by (i) thin thermal oxidation and then CVD of silicon dioxide to form a silicon dioxide layer (not shown) on top of the structure 100 (including on the bottom wall and side walls of the trench 210) of FIG. 2, and then (ii) directionally etching back the silicon dioxide layer until a top surface 122 of the nitride polish stop layer 120 is exposed to the surrounding ambient, and a surface 112 of the p-type silicon substrate 110 is exposed to the surrounding ambient at the bottom of the trench 210 of FIG. 3.

Figure 4:
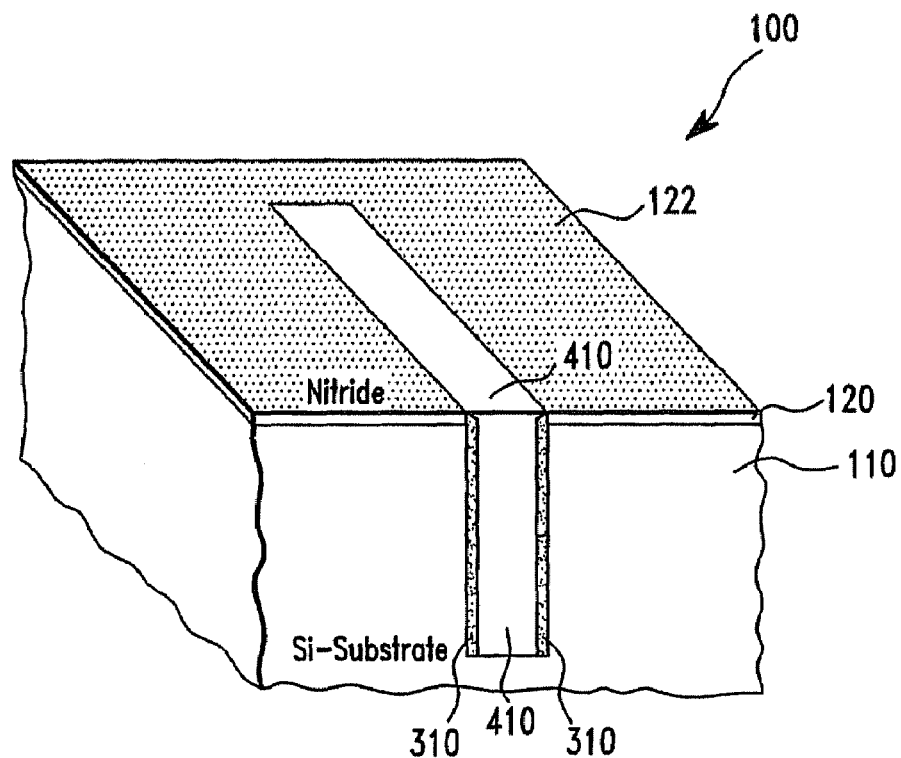

Next, with reference to FIG. 4, in one embodiment, the trench 210 of FIG. 3 is filled with heavily-doped n-type polysilicon to form a polysilicon region 410. Illustratively, the polysilicon region 410 is formed by (i) CVD of heavily-doped n-type polysilicon to form a polysilicon layer (not shown) everywhere on top of the structure 100 (including in the trench 210) of FIG. 3, and then (ii) planarizing the deposited polysilicon layer by CMP (Chemical Mechanical Polishing) until the nitride polish stop layer 120 is exposed to the surrounding ambient.

Figure 5A:
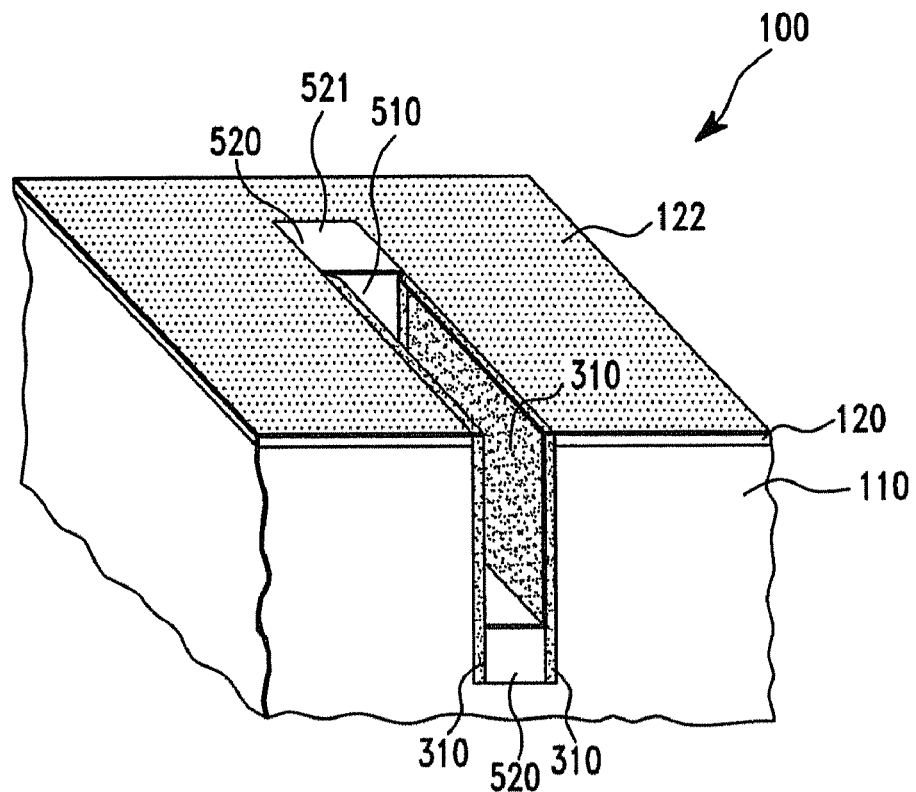

Next, with reference to FIG. 5A, in one embodiment, a trench 510 is formed in the polysilicon region 410 (FIG. 4). Illustratively, the trench 510 is formed by a conventional lithographic process followed by a directional etching step which removes a portion of the exposed polysilicon region 410 within the trench 210 (FIG. 2). Hereafter, a remaining L-shape polysilicon region 520 of the polysilicon region 410 (FIG. 4) is referred to as a polysilicon tab 520. The conventional lithographic process defines the location of a top surface 521 of the polysilicon tab 520 for which the polysilicon tab 520 remains co-planar with the top surface 1222 of the nitride polish stop layer 120.

Figure 5B:
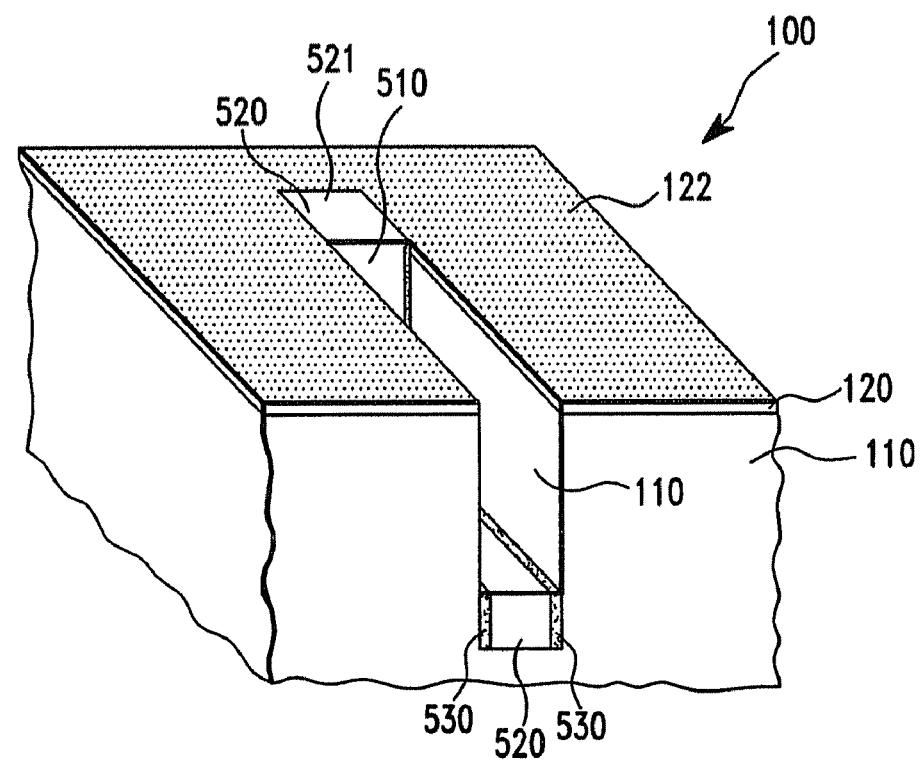

Next, with reference to FIG. 5B, in one embodiment, a wet etching step is performed to remove portions of the silicon dioxide side wall region 310 (FIG. 5A) that are exposed to the surrounding ambient. As a result, the p-type silicon substrate 110 is exposed to the surrounding ambient on the side walls of the trench 510. As seen in FIG. 5B, a remaining oxide region 530 of the silicon dioxide side wall region 310 (FIG. 5A) (after the wet etching step) sandwiches the polysilicon tab 520.

Figure 6:
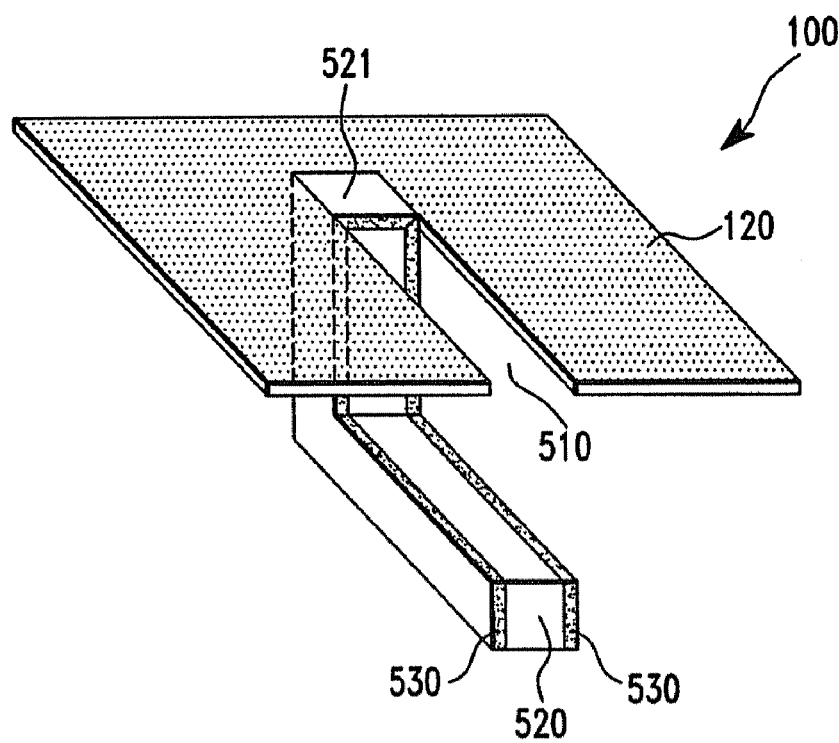

FIG. 6 shows the structure 100 of FIG. 5B without the p-type silicon substrate 110 for better observation. As seen in FIG. 6, the structure 100 comprises the nitride polish stop layer 120, the polysilicon tab 520 (with the top surface 521), and the oxide region 530 sandwiching the polysilicon tab 520.

Hereafter, the p-type silicon substrate 110 of FIG. 5B is omitted in the FIGS. 6-12B for clarity.

Figure 7A:
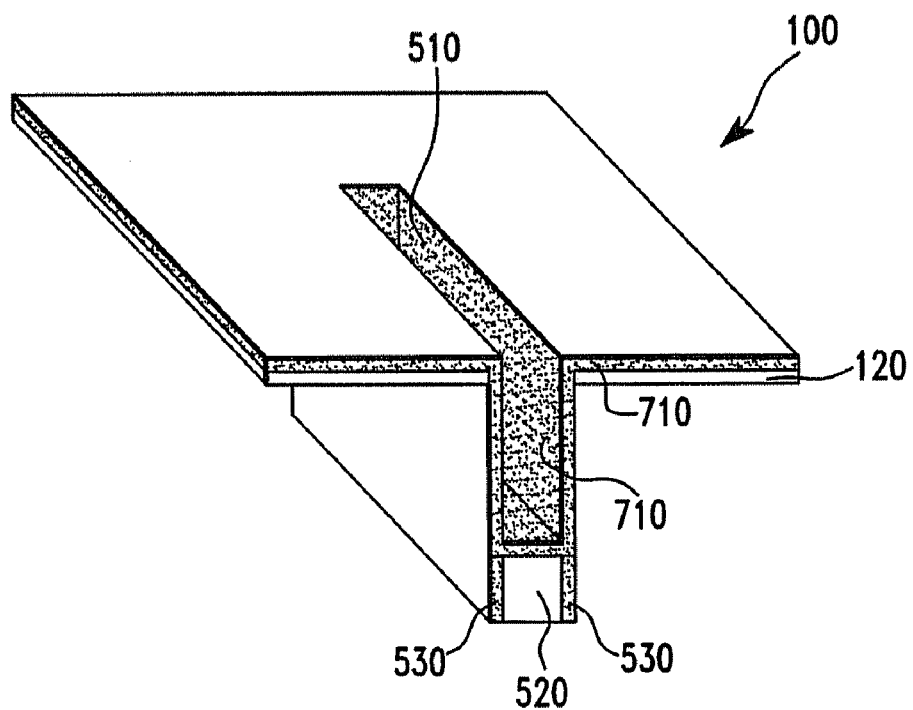

Next, with reference to FIG. 7A, in one embodiment, an oxide layer 710 is formed on the entire exposed surface of structure 100 of FIG. 5B (including on the bottom wall and side walls of the trench 510 of FIG. 5B). Illustratively, the oxide layer 710 is formed by CVD of silicon dioxide everywhere on the structure 100 of FIG. 5B, resulting in the oxide layer 710 as shown in FIG. 7A.

Figure 7B:
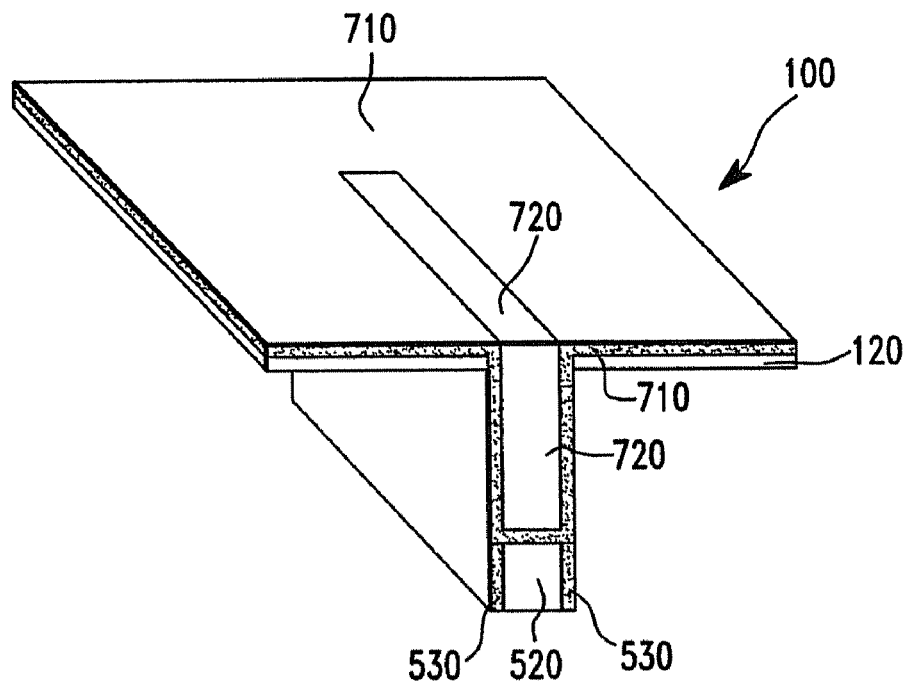

Next, with reference to FIG. 7B, in one embodiment, a polysilicon region 720 is formed in the trench 510 of FIG. 5B. Illustratively, the polysilicon region 720 is formed by (i) depositing heavily-doped n-type polysilicon everywhere on top of the structure 100 of FIG. 7A by CVD until the trench 510 is filled with heavily-doped n-type polysilicon, and then (ii) planarizing the deposited heavily-doped n-type polysilicon until the oxide layer 710 is exposed to the surrounding ambient.

Figure 8A:
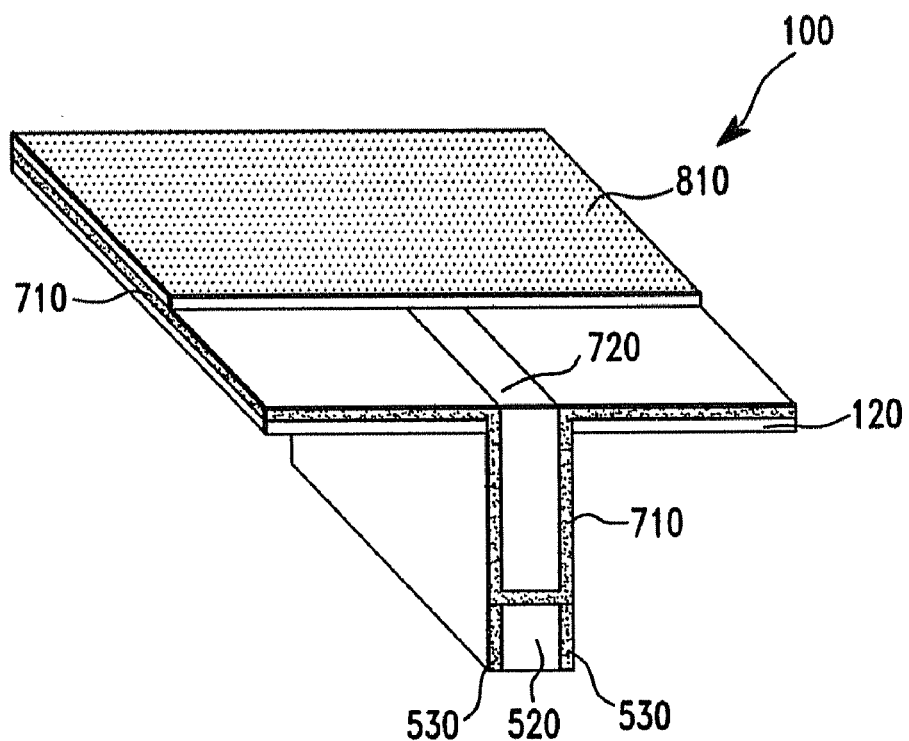

Next, with reference to FIG. 8A, in one embodiment, a patterned nitride layer 810 is formed on top of the structure 100 of FIG. 7B such that the entire top surface 521 (FIG. 6) of the polysilicon tab 520 and a portion of the polysilicon region 720 (FIG. 7B) are directly beneath the patterned nitride layer 810. Illustratively, the patterned nitride layer 810 is formed by depositing a blanket nitride film (not shown) and then using a conventional lithographic process followed by an etching step.

Figure 8B:
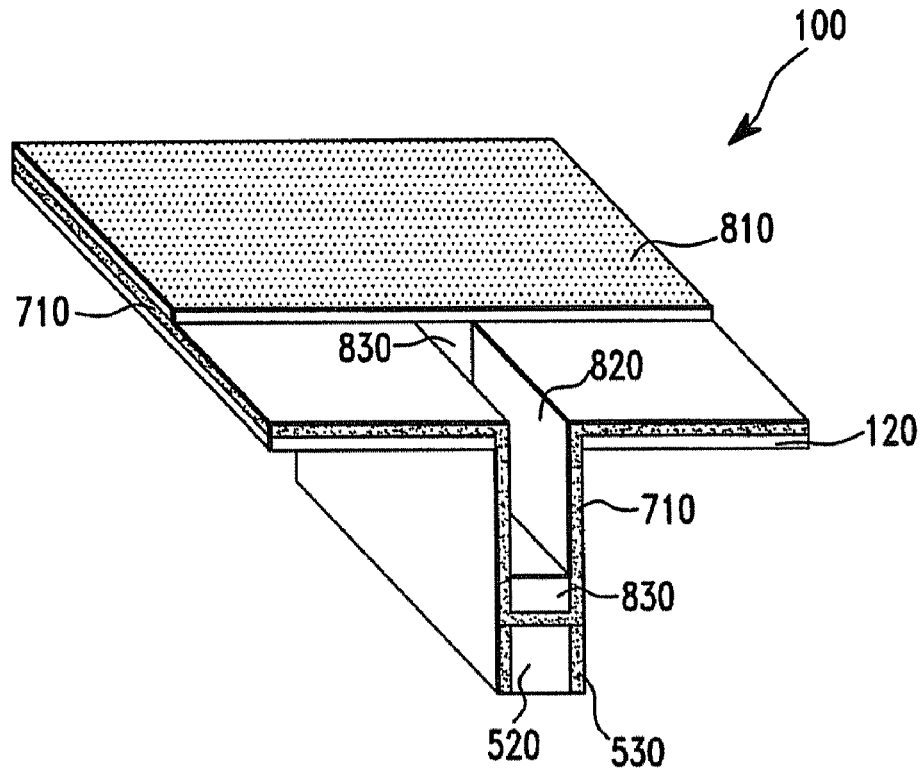

Next, with reference to FIG. 8B, in one embodiment, a trench 820 (aligned with the patterned nitride layer 810) is formed in the polysilicon region 720 (FIG. 8A). Illustratively, the trench 820 is formed by using the patterned nitride layer 810 as a blocking mask to directionally etch a portion of the polysilicon region 720 (FIG. 8A). The remaining portion of the polysilicon region 720 (FIG. 8A) after the etching step is a polysilicon tab 830 (which has an L-shape, although not recognizable in FIG. 8B).

Figure 9:
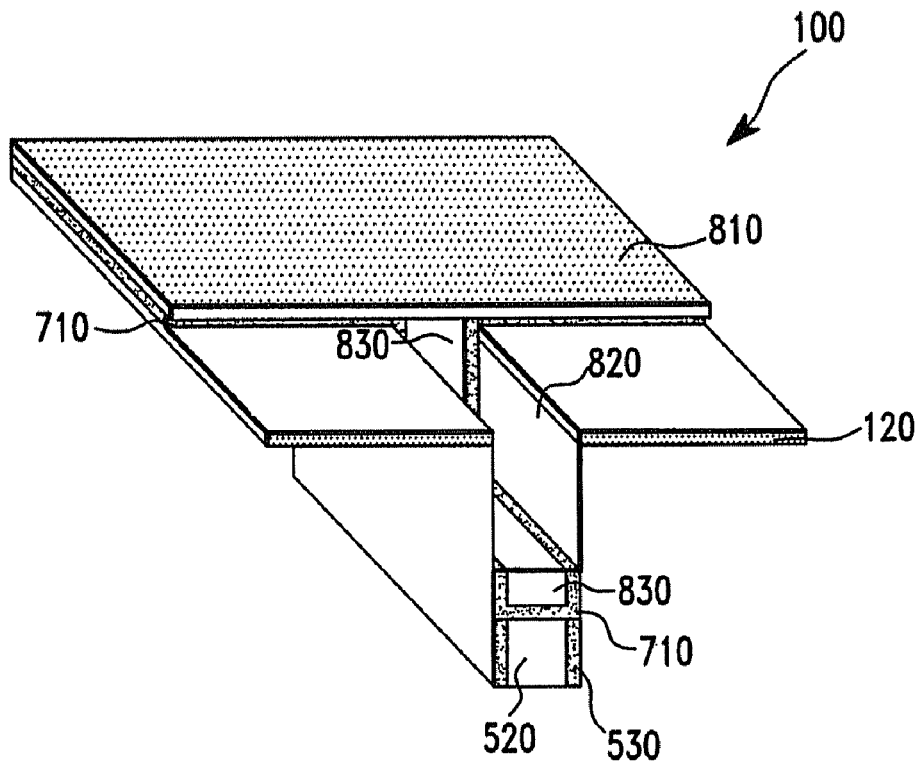

Next, in one embodiment, exposed portions of the oxide layer 710 are isotropically etched, resulting in the structure 100 of FIG. 9.

Figure 10A:
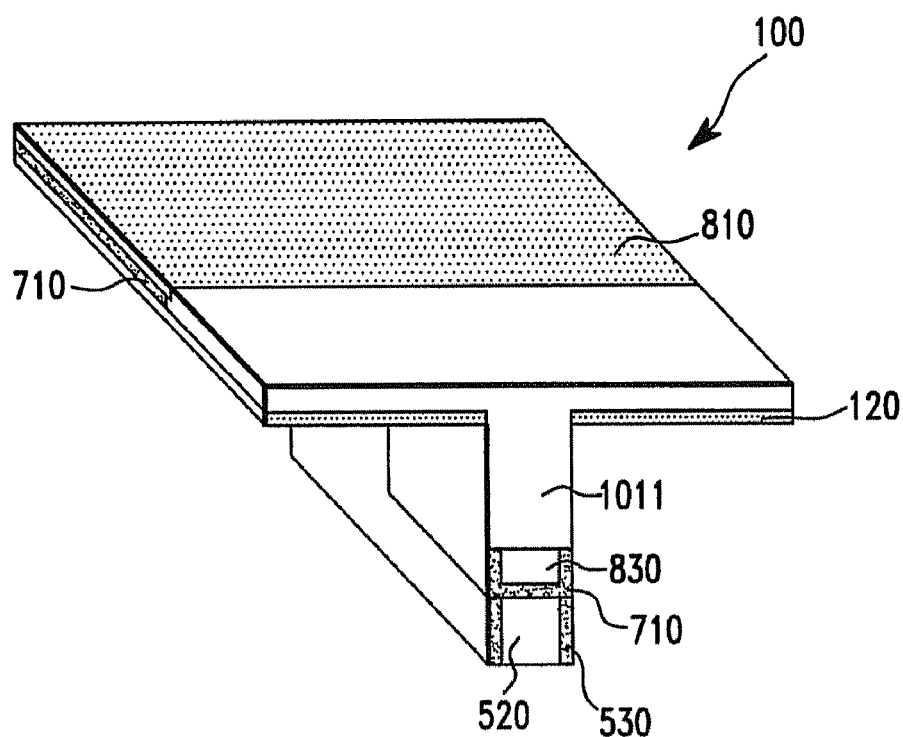

Next, with reference to FIG. 10A, in one embodiment, a polysilicon region 1011 is formed in the trench 820 (FIG. 9) and on top of the nitride polish stop layer 120 (as shown in FIG. 10A). Illustratively, the polysilicon region 1011 is formed by (i) depositing heavily-doped n-type polysilicon everywhere on top of the structure 100 of FIG. 9 by CVD (including in the trench 820 of FIG. 9), and then (ii) planarizing the deposited heavily-doped n-type polysilicon by CMP until the patterned nitride layer 810 is exposed to the surrounding ambient, resulting in structure 100 of FIG. 10A.

Next, with reference to FIG. 10B, in one embodiment, the polysilicon 1011 of FIG. 10A is directionally etched by RIE (Reactive Ion Etching) resulting in a polysilicon region 1010, which is recessed below the top surface of the p-type silicon substrate 110 (FIG. 1).

Figure 10B:
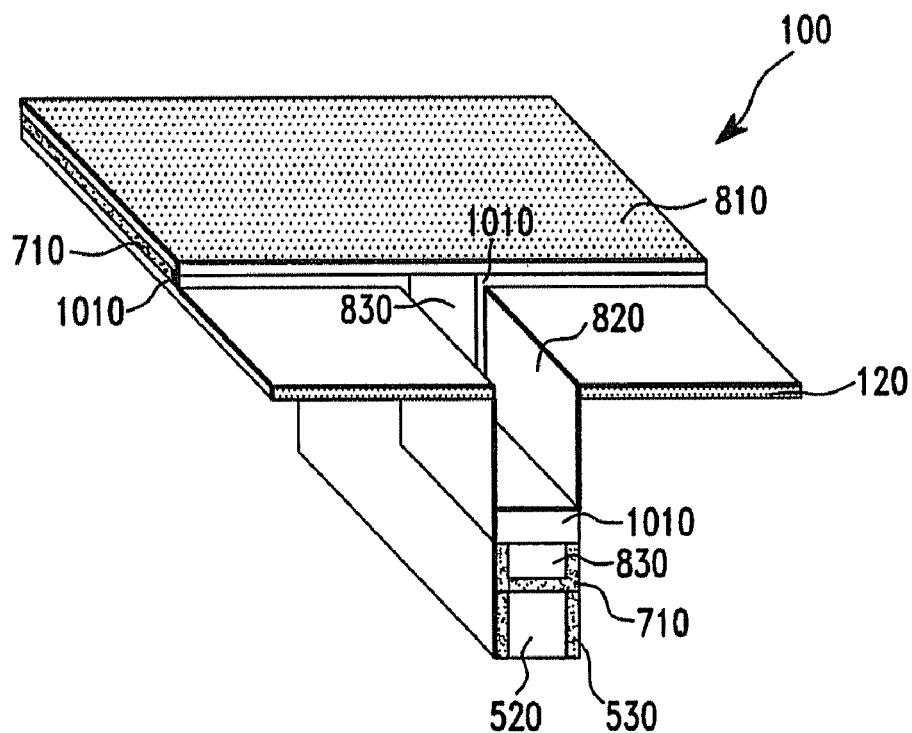
Figure 10C:
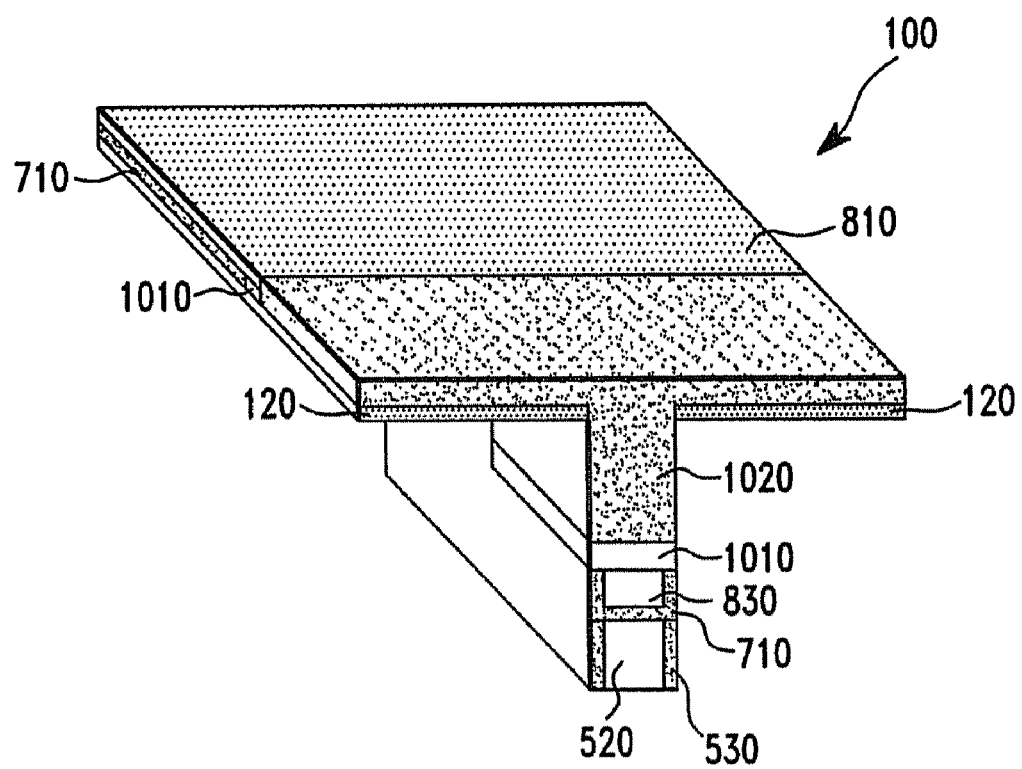

Next, with reference to FIG. 10C, in one embodiment, an oxide material (such as silicon dioxide) is (i) deposited on the entire surface of the structure 100 of FIG. 10B by CVD and then (ii) planarized by a CMP step until the nitride layer 810 is exposed to the surrounding ambient, resulting in the oxide region 1020 as shown in FIG. 1C.

Figure 11:
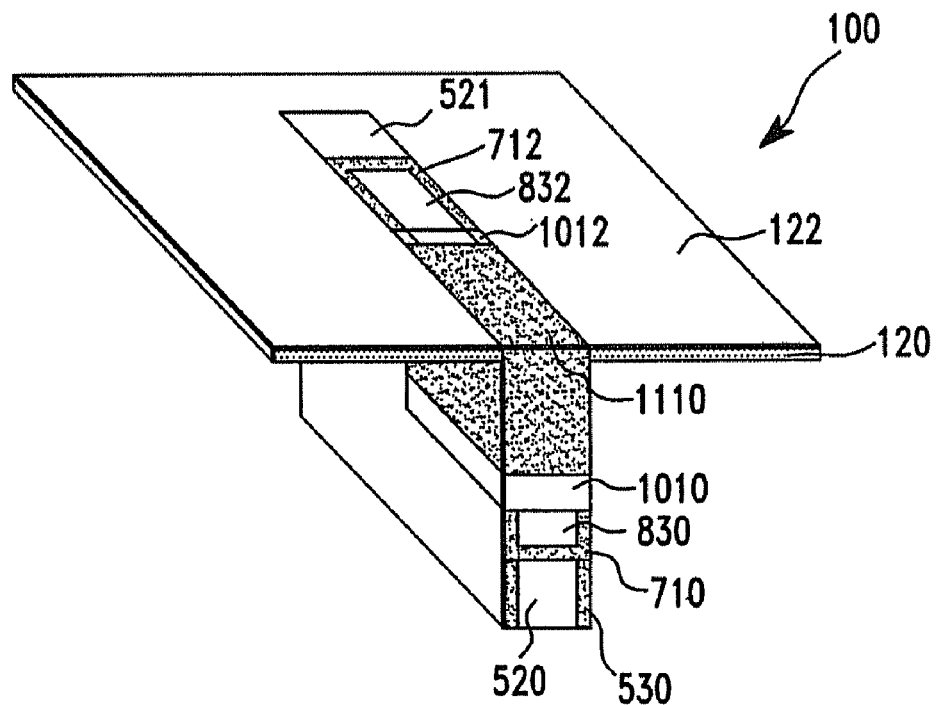

Next, with reference to FIG. 11, in one embodiment, all layers above the top surface 122 of the nitride polish stop layer 120 are removed by using a conventional process. As a result, the patterned nitride layer 810 (FIG. 10B), the oxide layer 710 (FIG. 10B), a portion of polysilicon 1010, and a portion of the oxide region 1020 (FIG. 10B) are removed, resulting in the structure 100 as shown in FIG. 11.

Hereafter, the remaining portion of the oxide region 1020 of FIG. 10C is referred to as an oxide region 1110 of FIG. 11. As a result of the removal described above, the top surface 521 of the polysilicon tab 520, a top surface 712 of the oxide layer 710, a top surface 832 of the polysilicon tab 830, and a top surface 1012 of the polysilicon region 1010 are exposed to the surrounding ambient at top of the structure 100 of FIG. 11.

Figure 12A:
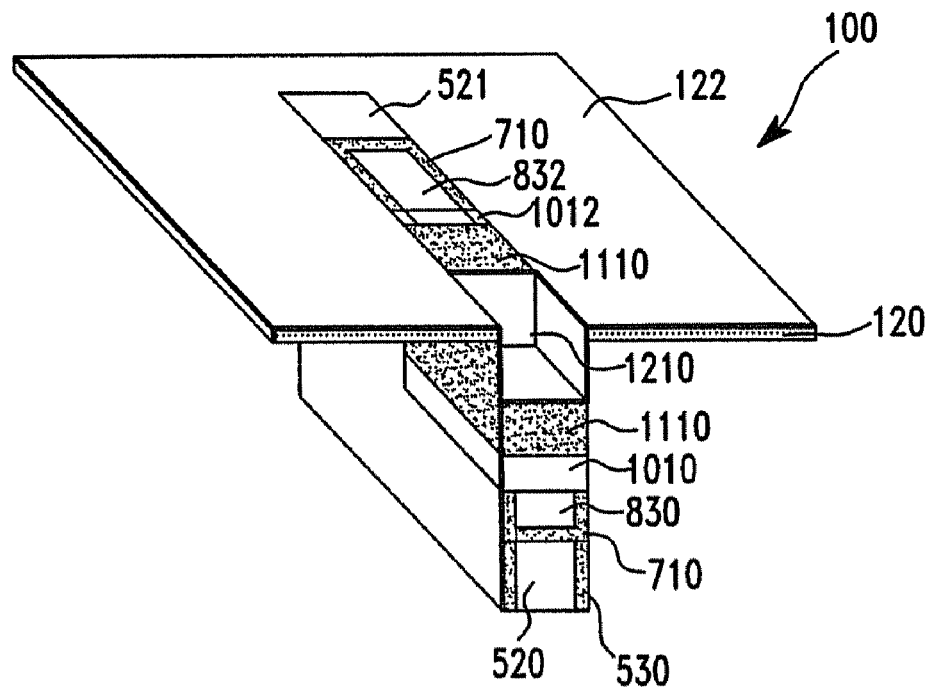

Next, with reference to FIG. 12A, in one embodiment, a trench 1210 is formed in the oxide region 1110 of FIG. 11. Illustratively, the trench 1210 is formed by a conventional lithographic process followed by an etching step.

Figure 12B:
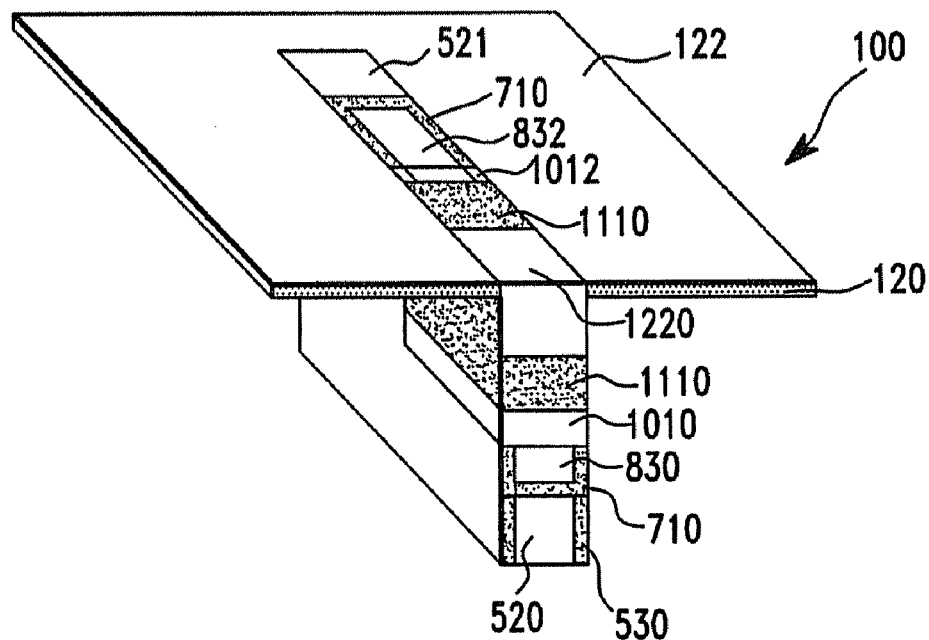

Next, with reference to FIG. 12B, in one embodiment, a polysilicon region 1220 is formed in the trench 1210 of FIG. 12A. Illustratively, the polysilicon region 1220 is formed by (i) CVD of heavily-doped n-type polysilicon until the trench 1210 (FIG. 12A) is filled, and then (ii) a CMP step.

Figure 12C:
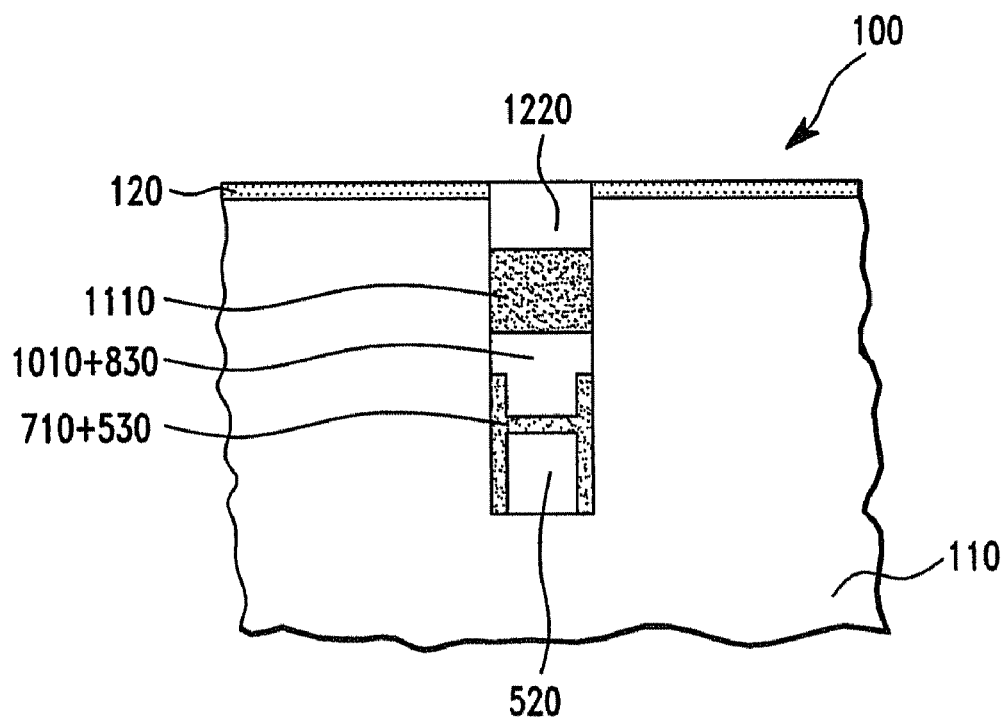

FIG. 12C shows a cross section view of the structure 100 of FIG. 12B. At this point of the first fabrication process, the structure 100 comprises the nitride polish stop layer 120, the polysilicon region 1220, the oxide region 1110, a polysilicon region 1010+830 (comprising the polysilicon region 1010 and the polysilicon tab 830), an oxide region 710+530 (comprising the oxide layer 710 and the oxide region 530), the polysilicon tab 520, and the p-type silicon substrate 110.

Figure 13A:
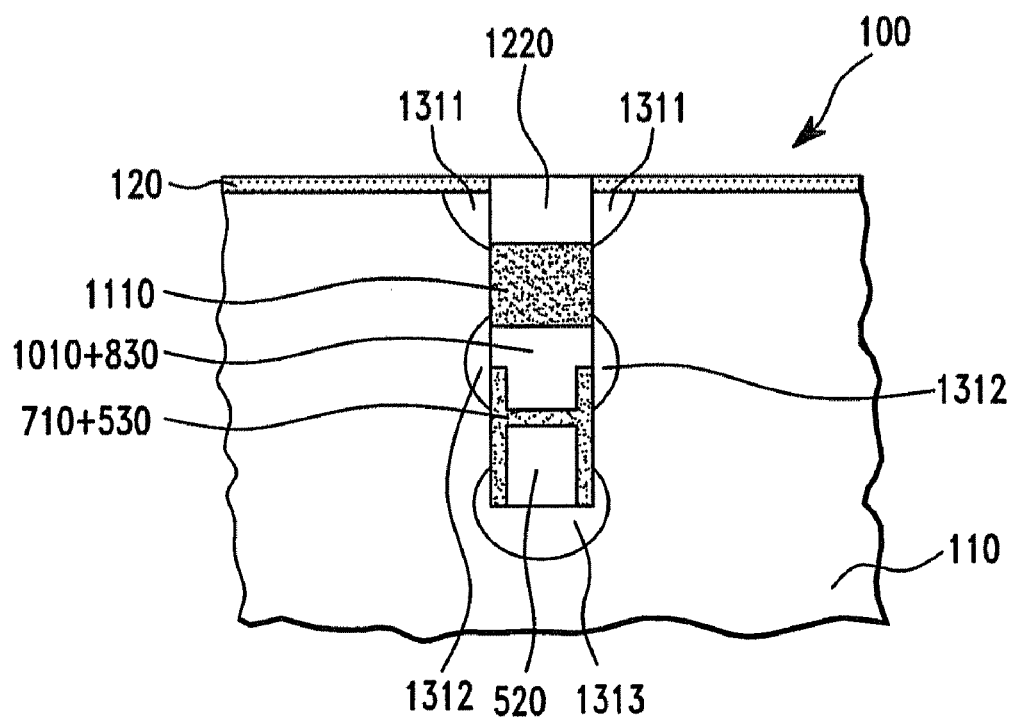

Next, with reference to FIG. 13A, in one embodiment, the structure 100 of FIG. 12C is heated at a high temperature so that the dopants in the polysilicon regions 1220, 1010+830, and 520 diffuse into the p-type silicon substrate 110, resulting in highly-doped n-type regions 1311, 1312, and 1313, respectively as shown in FIG. 13A.

Figure 13B:
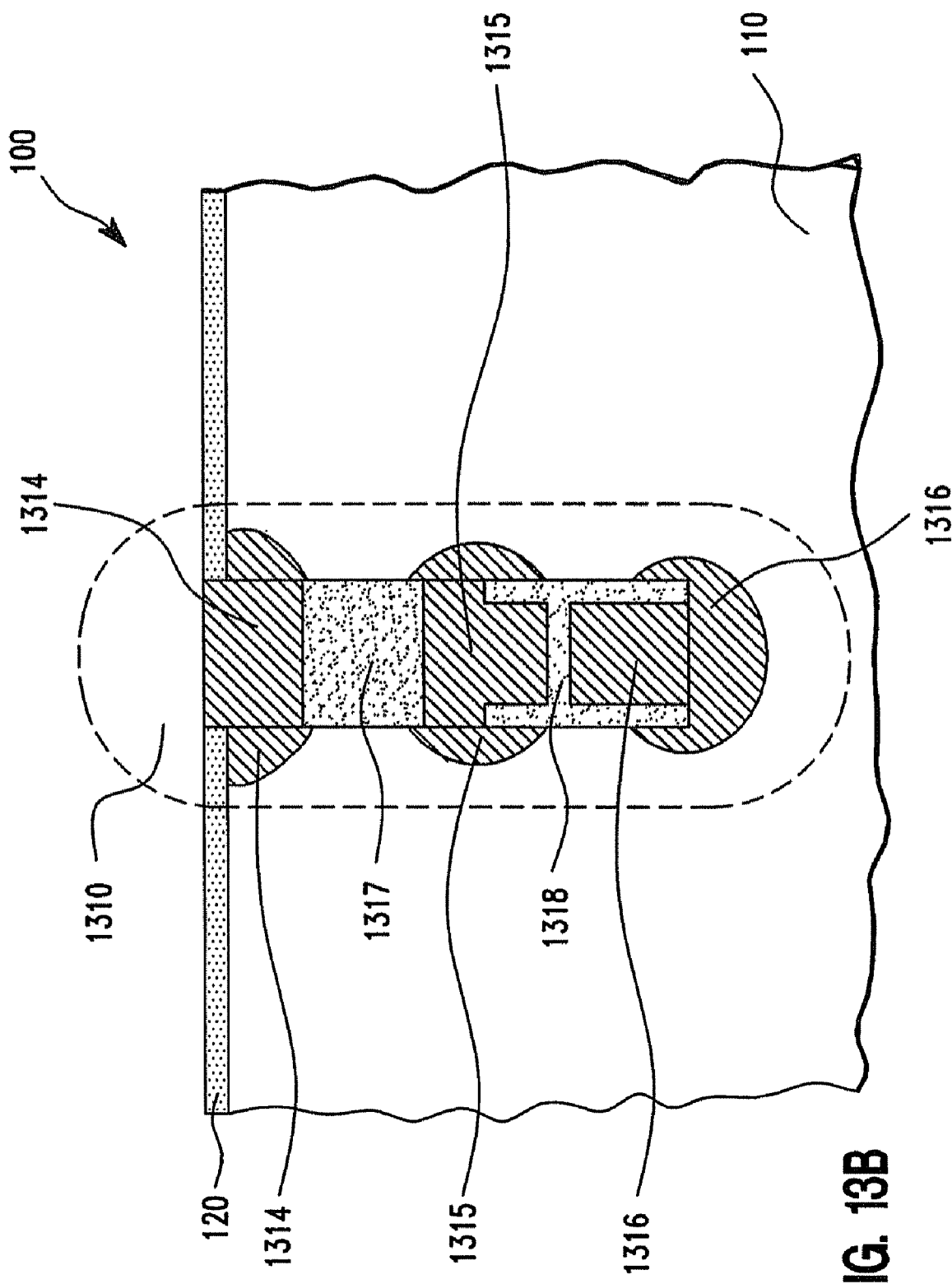

With reference to FIG. 13B, for simplicity, the polysilicon region 1220 and the highly-doped n-type region 1311 of FIG. 13A can be collectively referred to as an electrode 1314, the polysilicon region 1010+830 and the highly-doped n-type region 1312 of FIG. 13A can be collectively referred to as an electrode 1315 (FIG. 13B), and the polysilicon region 520 and the highly-doped n-type region 1313 of FIG. 13A can be collectively referred to as an electrode 1316 (FIG. 13B). The three electrodes 1314, 1315, and 1316 (which are electrically separated by oxide regions 1317 and 1318) can be collectively referred to as a block 1310. The electrode 1314 is already at the top surface of the structure 100, whereas the other two electrodes 1315 and 1316 are at different depths in the p-type silicon substrate 110 and separately and electrically linked to the top surface of the structure 100 at top surface 521 and top surface 832, respectively (FIG. 12B), by the polysilicon regions 520 and 830, respectively.

In the embodiments described above, for simplicity, the structure 100 comprises only one block 1310 (FIG. 13B). However, in general, the semiconductor optical sensor 100 can comprise multiple blocks similar to the block 1310.

Figure 13C:
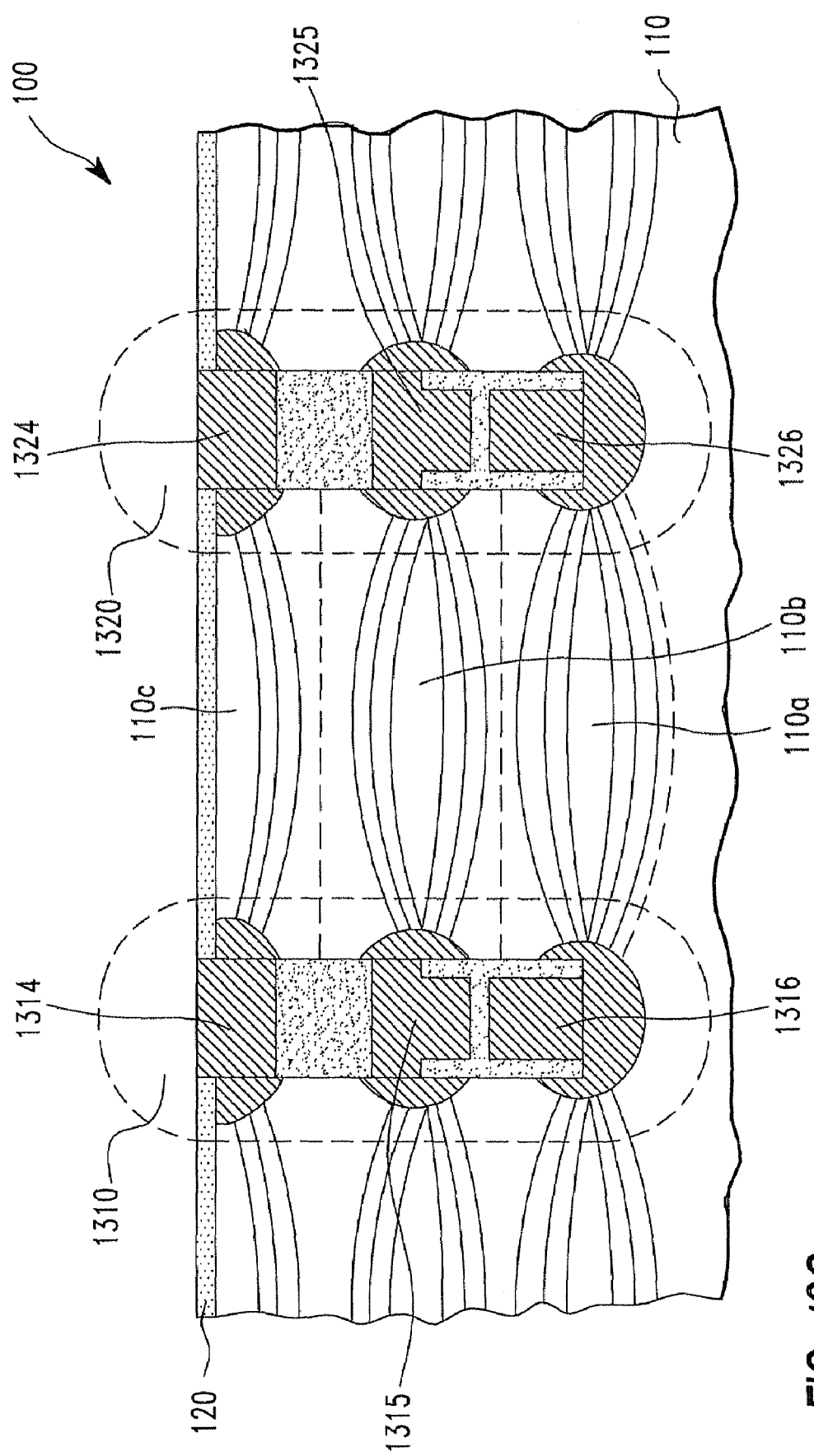

For illustration, FIG. 13C shows the structure 100 that comprises the block 1310 and another block 1320 similar to the block 1310. The block 1310 comprises the three electrodes 1314, 1315, and 1316 as described above. The block 1320 comprises three electrodes 1324, 1325, and 1326 similar to the three electrodes 1314, 1315, and 1316, respectively. As a result, the structure 100 of FIG. 13C can be considered comprising three electrode pairs: 1314-1324, 1315-1325, and 1316-1326. It should be noted that in FIG. 13C, the semiconducting block 110a+110b+110c of the silicon substrate 110 disposed between the two blocks 1310 and 1320 comprises three semiconducting regions 110a, 110b, and 110c which are in direct physical contact with each other as shown, wherein the first semiconducting region 110a is disposed between and in direct physical contact with the first electrode 1316 and the fourth electrode 1326, wherein the second semiconducting region 110b is disposed between and in direct physical contact with the second electrode 1315 and the fifth electrode 1325, and wherein the third semiconducting region 110c is disposed between and in direct physical contact with the third electrode 1314 and the sixth electrode 1324.

Figure 13D:
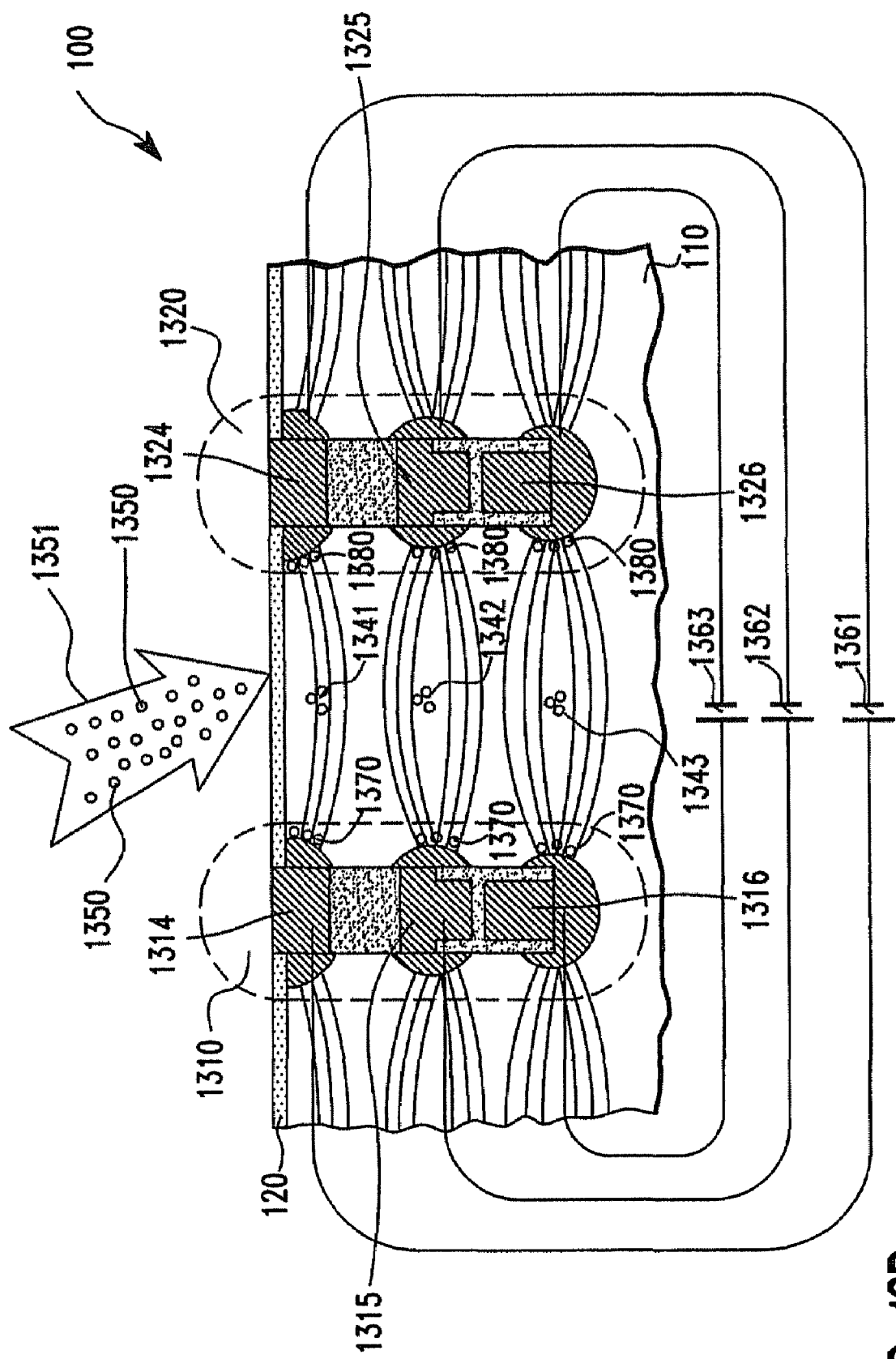

With reference to FIG. 13D, in one embodiment, the operation of the structure 100 is as follows. Photons 1350 of incident light 1351 go through the nitride polish stop layer 120 down to the p-type silicon substrate 110 (between the two blocks 1310 and 1320). Blue photons 1341, green photons 1342, and red photons 1343 of the photons 1350 (of the incident light 1351) go into the p-type silicon substrate 110 down to three different depths. The energy of the photons 1341, 1342, and 1343 are absorbed by the silicon atoms in the p-type silicon substrate 110, resulting in electron—hole pairs at the three different depths, corresponding to the three electrode pairs: 1314-1324, 1315-1325, and 1316-1326.

When the electrode pairs 1314-1324, 1315-1325, and 1316-1326 are connected to three different power sources 1361, 1362, and 1363, respectively the electrons 1370 move toward the electrodes coupled to the anode, and the holes 1380 move toward the electrodes coupled to the cathode, resulting in three independent electric currents whose current magnitudes are proportional to the number of the photons absorbed at each of the three depths in the p-type silicon substrate 110. Based on the three current magnitudes, the ratio of blue photons 1341, green photons 1342, and red photons 1343 of the incident light 1351 can be determined. As a result, the structure 100 of FIG. 13D plays the role of the semiconductor optical sensor which can be sensitive to quantities of photons having different colors (wave lengths).

FIGS. 14-18 show a second fabrication process for forming a semiconductor optical sensor 200, in accordance with embodiments of the present invention.

Figure 14:
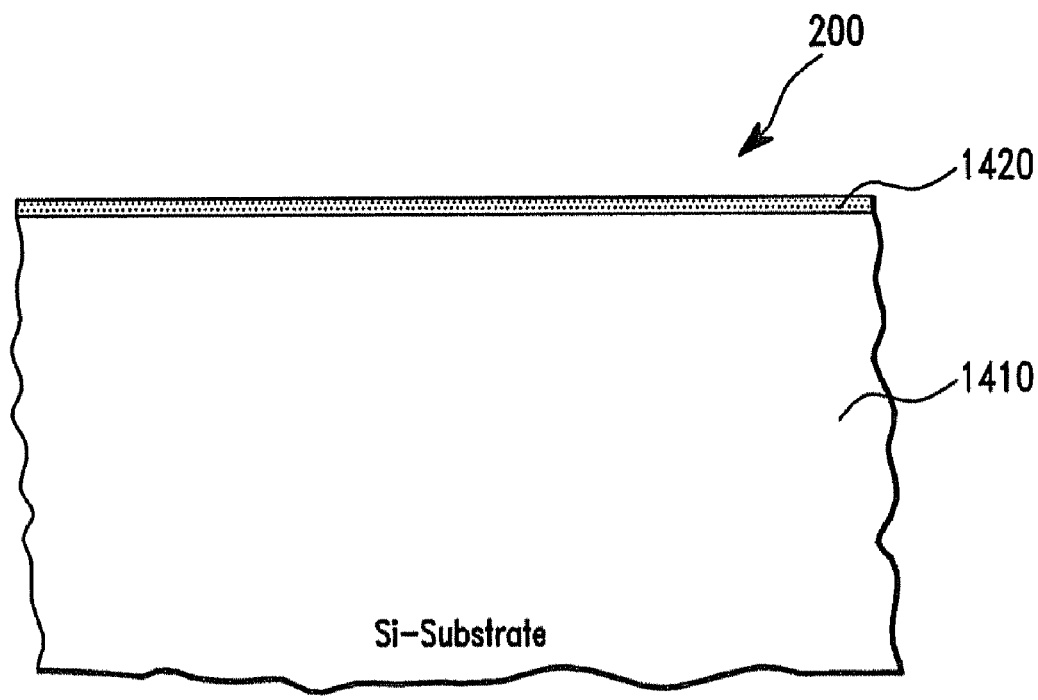
FIGS. 14-18 show the fabrication process of another semiconductor optical sensor, in accordance with embodiments of the present invention.

With reference to FIG. 14, in one embodiment, the second fabrication process starts out with a silicon substrate 1410. Next, in one embodiment, a nitride polish stop layer 1420 is formed on top of the silicon substrate 1410. Illustratively, the nitride polish stop layer 1420 is formed by CVD.

Figure 15:
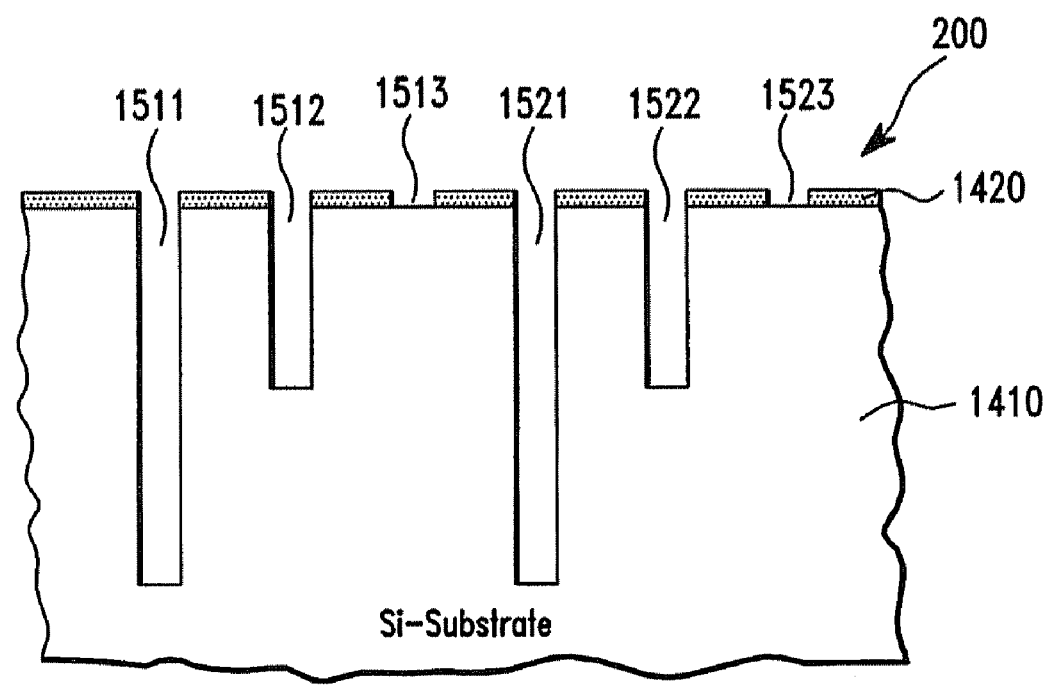

Next, with reference to FIG. 15, in one embodiment, trenches 1511, 1512, 1513, 1521, 1522, and 1523 are formed in the nitride layer 1420 and the silicon substrate 1410. Illustratively, the trenches 1511 and 1521 are formed by a conventional lithographic process followed by an etching step. Next, the trenches 1512, and 1522 are formed in the same manner (using a conventional lithographic process followed by an etching step). Next, similarly, the trenches 1513 and 1523 are formed by a conventional lithographic process followed by an etching step.

Figure 16:
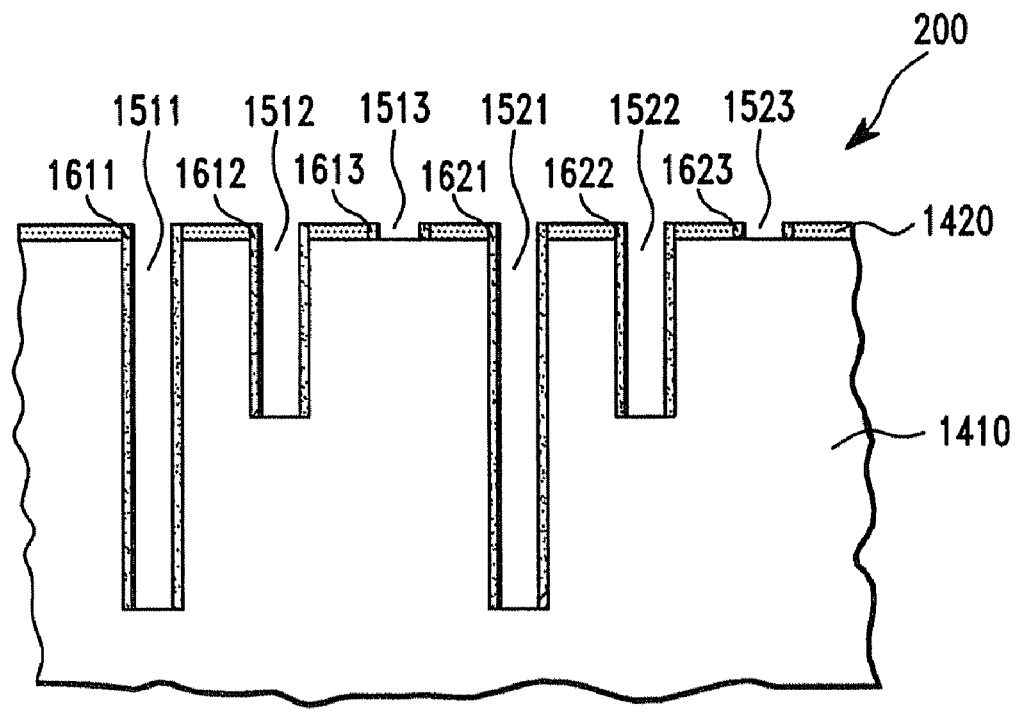

Next, with reference to FIG. 16, in one embodiment, oxide layers 1611, 1612, 1613, 1621, 1622, and 1623 are formed on the side walls of the trenches 1511, 1512, 1513, 1521, 1522, and 1523, respectively. Illustratively, oxide layers 1611, 1612, 1613, 1621, 1622, and 1623 are formed by (i) depositing silicon dioxide by CVD everywhere on the exposed surface of structure 200 of FIG. 15 (including on bottom walls and side walls of the trenches 1511, 1512, 1513, 1521, 1522, and 1523) so as to form a silicon dioxide layer (not shown), and then (ii) directionally etching back the deposited silicon dioxide layer, resulting in the oxide layers 1611, 1612, 1613, 1621, 1622, and 1623 as shown in FIG. 16.

Figure 17:
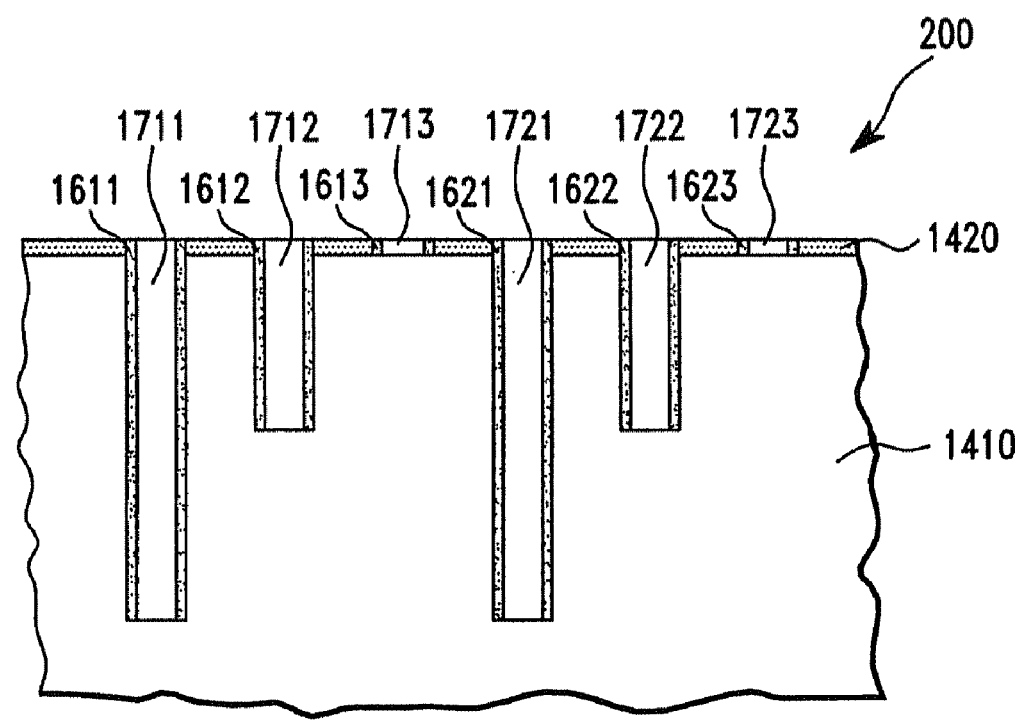

Next, with reference to FIG. 17, in one embodiment, polysilicon regions 1711, 1712, 1713, 1721, 1722, and 1723 are formed in the trenches 1511, 1512, 1513, 1521, 1522, and 1523 of FIG. 16, respectively. Illustratively, the polysilicon regions 1711, 1712, 1713, 1721, 1722, and 1723 are formed by (i) depositing of a heavily-doped n-type polysilicon layer (not shown) by CVD everywhere on exposed surfaces of the structure 200 (including in the trenches 1511, 1512, 1513, 1521, 1522, and 1523 of FIG. 16), and then (ii) planarizing the deposited heavily-doped n-type polysilicon layer on the surface of structure 200, resulting in the polysilicon regions 1711, 1712, 1713, 1721, 1722, and 1723 as shown in FIG. 17.

Figure 18:
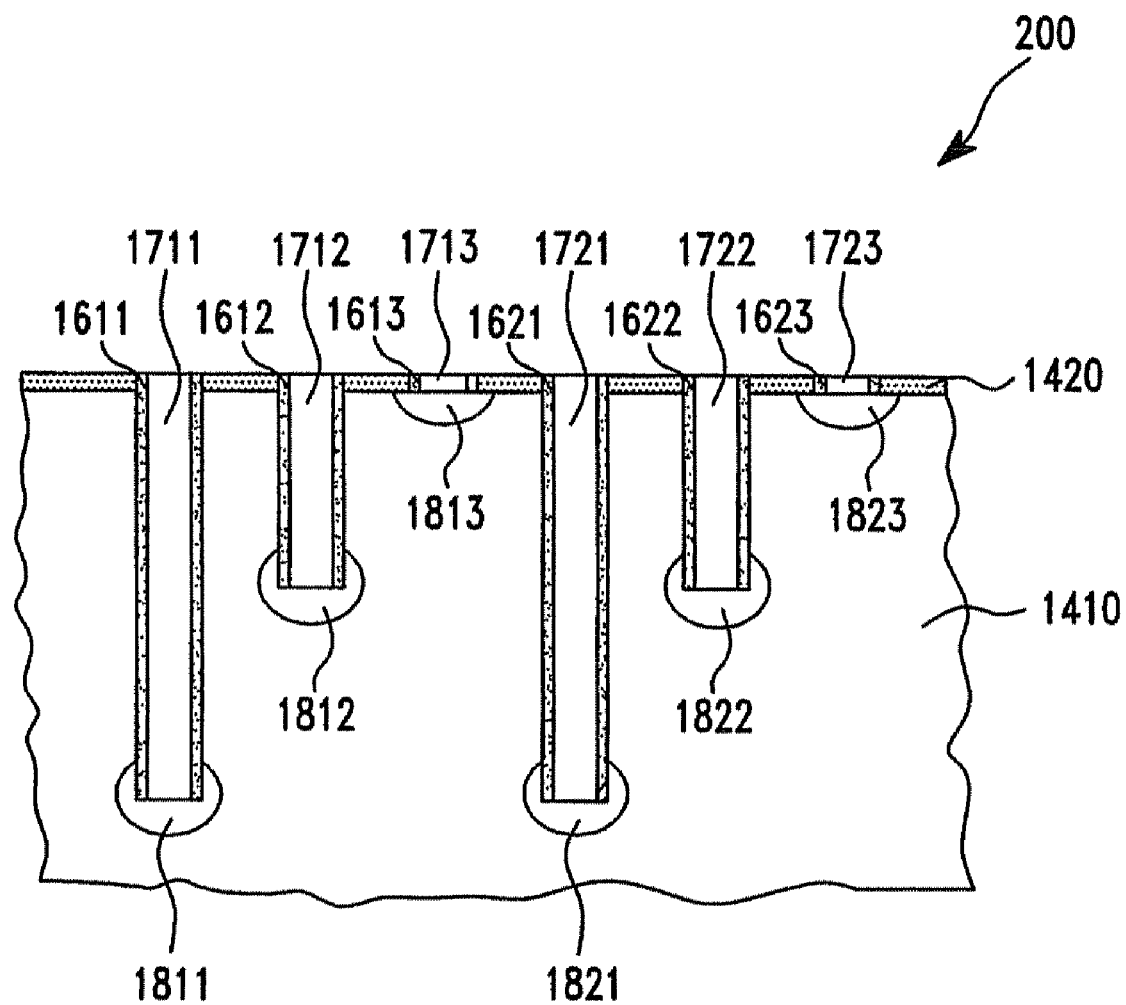

Next, with reference to FIG. 18, in one embodiment, the structure 200 of FIG. 17 is heated at a high temperature so that the dopants in the heavily-doped n-type polysilicon regions 1711, 1712, 1713, 1721, 1722, and 1723 diffuse into the silicon substrate 1410, resulting in doped regions 1811, 1812, 1813, 1821, 1822, and 1823, respectively as shown in FIG. 18.

In one embodiment, the operation of the structure 200 is similar to the operation of the structure 100 of FIG. 13D. Illustratively, blue photons, green photons, and red photons (not shown) go into the silicon substrate 1410 down through different depths. In one embodiment, electrons and holes created by red photons are collected predominantly by the associated electrode pair 1811-1821, electrons and holes created by green photons are collected predominantly by the associated electrode pair 1812-1822, and electrons and holes created by blue photons are collected predominantly by the associated electrode pair 1813-1823.

In summary, with reference to FIG. 13D, the structure 100 can function as three photo-diodes operating at three different depths in the p-type semiconductor substrate 110. The first photo-diode has two n-type doped diode electrodes 1316 and 1326 and operates at the deepest depth in the p-type semiconductor substrate 110. The second photo-diode has two n-type doped diode electrodes 1315 and 1325 and operates at the medium depth in the p-type semiconductor substrate 110. The third photo-diode has two n-type doped diode electrodes 1314 and 1324 and operates at the shallowest depth in the p-type semiconductor substrate 110. It should be noted that if the semiconductor substrate 110 is doped n-type, the diode electrodes 1314, 1324, 1315, 1325, 1316, and 1326 are heavily doped p-type. In other words, the dopants of the diode electrodes 1314, 1324, 1315, 1325, 1316, and 1326 and the dopants of the semiconductor substrate 110 are of opposite doping polarities.

In the embodiments described above, with reference to FIG. 13D, the electrodes 1314, 1315, 1316, 1324, 1325, and 1326 are all doped n-type. Alternatively, the electrodes 1314, 1315, are 1316 are doped n-type, but the electrodes 1324, 1325, and 1326 are doped p-type.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:
   providing a structure which comprises a semiconductor substrate;
   forming a first electrode and a fourth electrode at a first depth in the semiconductor substrate;
   after said forming the first and fourth electrodes is performed, forming a second electrode and a fifth electrode at a second depth in the semiconductor substrate; and
   after said forming the second and fifth electrodes is performed, forming a third electrode and a sixth electrode at a third depth in the semiconductor substrate,
   wherein the first depth is greater than the second depth,
   wherein the second depth is greater than the third depth,
   wherein a first semiconducting region of the semiconductor substrate is disposed between and in direct physical contact with the first and fourth electrodes,
   wherein a second semiconducting region of the semiconductor substrate is disposed between and in direct physical contact with the second and fifth electrodes,
   wherein a third semiconducting region of the semiconductor substrate is disposed between and in direct physical contact with the third and sixth electrodes, and
   wherein the first, second, and third semi-conducting regions are in direct physical contact with each other.

2. The method of claim 1, further comprising:
   after said forming the first and fourth electrodes and before said forming the second and fifth electrodes are performed, forming a first dielectric region and a third dielectric region,
   wherein the first dielectric region is disposed between the first and second electrodes, and
   wherein the third dielectric region is disposed between the fourth and fifth electrodes; and
   after said forming the second and fifth electrodes and before said forming the third and sixth electrodes are performed, forming a second dielectric region and a fourth dielectric region,
   wherein the second dielectric region is disposed between the second and third electrodes, and
   wherein the fourth dielectric region is disposed between the fifth and sixth electrodes.

3. The method of claim 2,
   wherein the first, second, third, fourth, fifth, and sixth electrodes comprise polysilicon, and
   wherein the first, second, third, and fourth dielectric regions comprise silicon dioxide.

4. The method of claim 1,
   wherein the first, second, and third electrodes are overlapping, and
   wherein the fourth, fifth, and sixth electrodes are overlapping.

5. The method of claim 1,
   wherein each of the first, second, fourth, and fifth electrodes has an L-shape, and
   wherein vertical members of the L-shapes of the first, second, fourth, and fifth electrodes lead to a top surface of the semiconductor substrate.

* * * * *